(12) United States Patent
Lee

(10) Patent No.: US 7,312,966 B2
(45) Date of Patent: Dec. 25, 2007

(54) ELECTROSTATIC DISCHARGE PROTECTION CIRCUIT

(75) Inventor: Hyun-Woo Lee, Ichon-shi (KR)

(73) Assignee: Hynix Semiconductor Inc., Kyungki-do (KR)

(*) Notice: Subject to any disclaimer, the term of this patent is extended or adjusted under 35 U.S.C. 154(b) by 65 days.

(21) Appl. No.: 11/015,813

(22) Filed: Dec. 20, 2004

(65) Prior Publication Data
US 2005/0152082 A1 Jul. 14, 2005

(30) Foreign Application Priority Data
Dec. 29, 2003 (KR) .................. 10-2003-0098493

(51) Int. Cl.
*H02H 9/00* (2006.01)
(52) U.S. Cl. ........................................ 361/56
(58) Field of Classification Search .................. 361/56
See application file for complete search history.

(56) References Cited

U.S. PATENT DOCUMENTS 5,631,793 A * 5/1997 Ker et al. ................... 361/56
6,327,125 B1 * 12/2001 Colclaser et al. ............. 361/56
6,388,850 B1 * 5/2002 Ker et al. .................... 361/56
6,414,532 B1 7/2002 Su et al.
6,414,831 B1 * 7/2002 Orchard-Webb ............ 361/111
6,545,321 B2 4/2003 Morishita
6,560,081 B1 5/2003 Vashchemko et al.
6,611,407 B1 * 8/2003 Chang ........................ 361/56
6,671,153 B1 12/2003 Ker et al.
6,855,586 B2 2/2005 Walker et al.
2004/0232492 A1 * 11/2004 Ker et al. .................... 257/355

FOREIGN PATENT DOCUMENTS

JP       08-111508      4/1996
KR     1020030058253    7/2003

* cited by examiner

*Primary Examiner*—Ronald W. Leja
(74) *Attorney, Agent, or Firm*—Lowe Hauptman Ham & Berner LLP

(57) ABSTRACT

Disclosed is an ESD protection circuit for use in a semiconductor memory device with enhanced ESD efficiency. The ESD protection circuit includes: an input pad for receiving a data; a data input buffer for transmitting the data inputted from the input pad to an internal circuit; a first discharging means for a HBM/MM ESD connected to the input pad; and a second discharging means provided with at least one diode for a CDM ESD, disposed between the first discharging means and the data input buffer.

8 Claims, 3 Drawing Sheets

US 7,312,966 B2

ELECTROSTATIC DISCHARGE PROTECTION CIRCUIT

FIELD OF INVENTION

The present invention relates to a semiconductor device; and, more particularly, to an electrostatic discharge protection (ESD) circuit for protecting the semiconductor device against detrimental effect of ESD phenomenon.

DESCRIPTION OF PRIOR ART

Generally, an electrostatic discharge (ESD) protection circuit is formed between an internal chip circuit and an input pad where external input/output pins are connected, in order to protect a semiconductor device against a detrimental impact of an ESD phenomenon, i.e., destruction or deterioration of the semiconductor device.

The ESD phenomenon is likely to occur when conductive objects are coupled each other, because there is happened a high voltage difference between the conductive objects. If an electrostatic current flows through the internal chip circuit where a power voltage is generally set to 5 volt, the internal chip circuit elements are fatally damaged. Therefore, it is necessary to secure an electrostatic current pathway in the semiconductor device so that the electrostatic current may flow out stably without any damage to the internal chip circuit. To meet the demand, the electrostatic current pathway should be designed such that electrostatic charges can be discharged instantly and effectively.

The electrostatic discharge occurs along two pathways according to a discharging direction. One is happened when a voltage of the external object is higher than that of the internal chip circuit, whereby the electrostatic current flows from the external object to the internal chip circuit. The other is happened when the voltage of the external object is lower than that of the internal chip circuit so that the electrostatic current flows from the internal chip circuit to the external object.

In the semiconductor device, the ESD phenomenon is normally generated when a person or a metallic object is in contact with the semiconductor device so that the electrostatic current flows from the person or the metallic object into the semiconductor device through the input/output pins. Additionally, the ESD phenomenon is also generated when the semiconductor device is mounted on a printed circuit board or the semiconductor device contacts with some external objects while handling the semiconductor device, so that the electrostatic charges are discharged from the internal chip circuit into the external objects.

As typical models for analyzing the ESD phenomenon, there are introduced three models, i.e., a human body model (HBM), a machine model (MM) and a charged device model (CDM). The HBM ESD model is used to test an ESD effect on the semiconductor device when the electrostatic charges are discharged from the human body to the internal chip circuit of the semiconductor device. The MM ESD model is utilized for testing the ESD effect on the semiconductor device while the electrostatic charges due to a charged die or a charged apparatus are discharged. The CDM ESD model, unlike the HBM or the MM ESD model, is used for testing the ESD effect on the semiconductor device when a charged device itself is discharged instantly through the internal chip circuit. That is, the discharging direction according to the CDM ESD model is opposite to that of the HBM or the MM ESD model. In particular, the CDM ESD model is highlighted nowadays because the semiconductor device may be damaged so as to decrease a product yield when the charged device is discharged during a manufacturing process. Therefore, it is necessary to form an ESD protection circuit for preventing the semiconductor device from the detrimental effect of the ESD current according to the HBM, the MM or especially the CDM ESD model.

Referring to FIG. 1, there is shown a conventional ESD protection circuit 100 of the semiconductor device.

In FIG. 1, the conventional ESD protection circuit 100 includes an input pad 105 for a data input, a first discharging circuit 110 for the HBM or the MM ESD model, a second discharging circuit 120 for the CDM ESD model and a data input buffer 130 for transmitting the data inputted through the input pad 105 into an internal circuit (not shown) of the semiconductor device.

The first discharging circuit 110 has a PMOS transistor 112 and an NMOS transistor 114, wherein one side and a gate of the PMOS transistor 112 are connected to a power supply voltage VDD and the other side of the PMOS transistor 112 is connected to the input pad 105, and one side and a gate of the NMOS transistor 114 are connected to a ground voltage VSS and the other side of the NMOS transistor 114 is connected to the input pad 105.

The second discharging circuit 120 has a resistor 122 and a MOS transistor 124, wherein one side of the resistor 122 is connected to the input pad 105 and the other is connected to the data input buffer 130, and one side and a gate of the MOS transistor 124 are connected to the ground voltage VSS and the other is connected to the other side of the resistor 122.

The data input buffer 130 has a PMOS transistor 132, a first NMOS transistor 134 and a second NMOS transistor 136. Here, one side and a gate of the PMOS transistor 132 are connected to the power supply voltage VDD and the other side is connected to one side of the first NMOS transistor 134, wherein a first control signal 133 is inputted into a gate thereof. One side of the second NMOS transistor 136 is connected to the ground voltage VSS and the other side is connected to the other side of the first NMOS transistor 134, wherein a second control signal 135 is inputted a gate thereof. The first NMOS transistor 134 is disposed between the PMOS transistor 132 and the second NMOS transistor 136.

The first discharging circuit 110 for the HBM and the MM ESD model plays a role in discharging electrostatic charges when a high or a low voltage induced by the external objects is applied to the input pad 105. The second discharging circuit 120 which is designed for the CDM model is used for discharging the electrostatic charges accumulated in the charged device through the input pad 105 so that the internal circuit of the semiconductor device may be protected against the ESD detrimental effect. Therefore, the second discharging circuit 120 should be disposed near to the data input buffer 130 and a power supply is commonly used with the data input buffer 130. The resistor 122 in the second discharging circuit 120 is employed in order to reduce the electrostatic current capacity so that the resistor 122 has typically resistance of several hundreds of ohms.

The conventional ELD protection circuit 100, however, has several shortcomings so that it is not appropriate to be applied to a highly-integrated circuit device. That is, since there are employed only the PMOS transistor 112 and the NMOS transistor 114 in the first discharging circuit 110 for the HBM or the MM electrostatic discharge, the first discharging circuit 110 is not able to discharge the electrostatic charges instantly and effectively. Accordingly, the electrostatic charges induced by the external object may be inputted into the gate of the MOS transistor in the data input buffer 130, to thereby fatally damage the MOS transistor after all. In particular, as the MOS transistor has a thin oxide film to meet a design rule for manufacturing the highly-integrated semiconductor device, the damage of the MOS transistor incurred by the HBM or the MM electrostatic discharges becomes more serious problem.

Furthermore, there is another problem that it is difficult to apply the conventional ESD protection circuit 100 to the semiconductor device which is operated in high operational frequency. Namely, when operational frequency is low, the use of the resistor 122 in the second discharging circuit 120 does not make a problem in transmitting an input signal to the data input buffer 130. But, as the operational frequency is higher and higher, a bandwidth of the input signal is narrower and narrower so that the input signal with narrow bandwidth is hardly transmitted to the data input buffer 130 through the resistor 122. In detail, when the input signal of scores of mili-volts with high frequency is applied to the semiconductor device, the input signal is not able to be transmitted to the data input buffer 130 stably owing to interruption of the resistor 122. This is also a serious drawback according to the conventional ESD protection circuit 100. Moreover, since there may be a parasitic capacitor at a node where the resistor 122 of the second discharging circuit 120 are connected, the resistor 122 and the parasitic capacitor makes the circuit of the semiconductor device have low pass filter (LPF) characteristics so that the input signal of high frequency can not pass the second discharging circuit 120 stably.

Eventually, these problems make it difficult for the semiconductor device to be operable with high speed and with high reliability.

SUMMARY OF INVENTION

It is, therefore, an object of the present invention to provide an electrostatic discharge (ESD) protection circuit for discharging electrostatic charges instantly and effectively and for stably transmitting an input signal of high frequency to an input buffer without any attenuation.

In accordance with an aspect of the present invention, there is provided an electrostatic discharge (ESD) protection circuit for a charged device mode (CDM), including: an input pad for receiving a data; a data input buffer for transmitting the data inputted from the input pad to an internal circuit; a diode disposed between the input pad and a ground of the data input buffer, for discharging charges accumulated in an internal circuit through the input pad.

In accordance with another aspect of the present invention, there is provided an ESD protection circuit for a human body model (HBM) and a machine model (MM), including: an input pad for receiving a data; a data input buffer for transmitting the data inputted from the input pad to an internal circuit; an NMOS transistor of which one side is connected to a ground and the other side is connected to the input pad; a bias MOS transistor of which one side is connected to a gate of the NMOS transistor for turning on the NMOS transistor, wherein a power supply voltage is applied to a gate thereof; and a capacitor disposed between the input pad and the bias MOS transistor.

In accordance with further another aspect of the present invention, there is provided an electrostatic discharge (ESD) protection circuit, including: an input pad for receiving a data; a data input buffer for transmitting the data inputted from the input pad to an internal circuit; a first discharging means for a HBM/MM ESD connected to the input pad; and a second discharging means provided with at least one diode for a CDM ESD, disposed between the first discharging means and the data input buffer.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, an electrostatic discharge (ESD) protection circuit for use in a semiconductor device in accordance with preferred embodiments of the present invention will be described in detail referring to the accompanying drawings.

Figure 1:
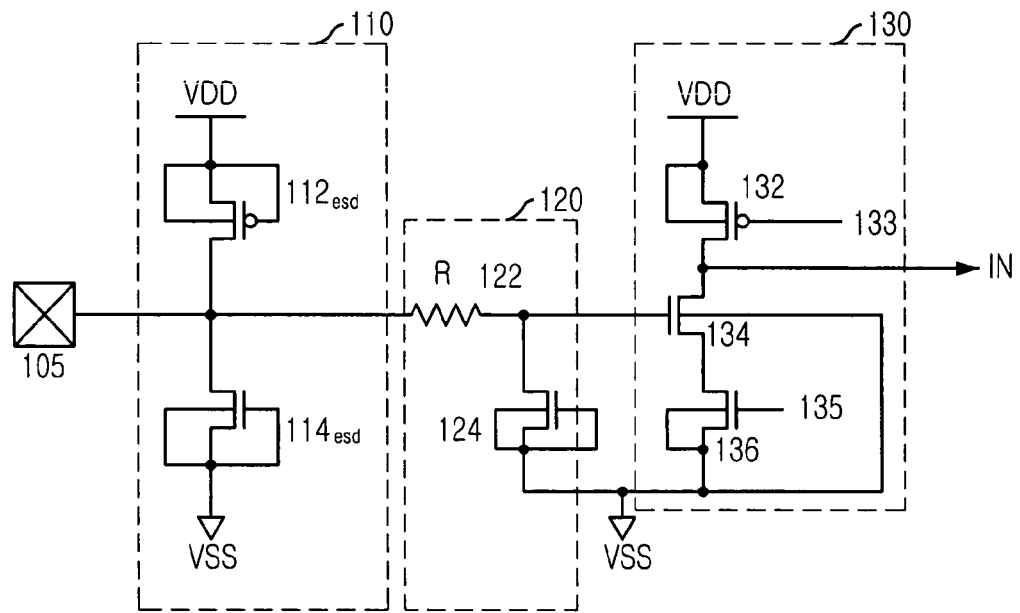
FIG. 1 is a conventional electrostatic discharge (ESD) protection circuit of a semiconductor device.
Figure 2:
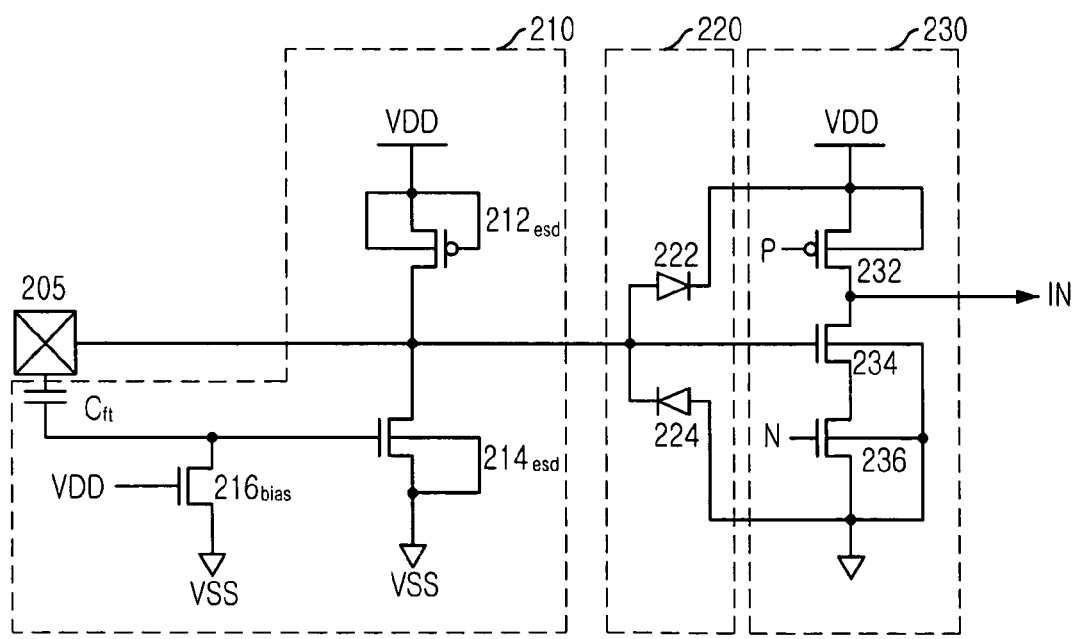
FIG. 2 is an ESD protection circuit of the semiconductor device in accordance with a first preferred embodiment of the present invention.

Referring to FIG. 2, there is shown an ESD protection circuit 200 of the semiconductor device in accordance with a first preferred embodiment of the present invention.

In FIG. 2, the inventive ESD protection circuit 200 includes an input pad 205 for receiving an input data, a data input buffer 230 for transmitting the data received through the input pad 205 to an internal circuit (not shown) of the semiconductor device, a first discharging circuit for a HBM/MM electrostatic discharge 210 and a second discharging circuit for a CDM electrostatic discharge 220.

Herein, the first discharging circuit 210 is used for discharging electrostatic charges generated by contact with an external object, i.e., for the HBM/MM electrostatic discharge. That is, the discharging unit 210 provides a discharging pathway that the electrostatic charges incurred by a human body or metallic objects are discharged.

The first discharging circuit 210 has a PMOS transistor 212, an NMOS transistor 214, a bias NMOS transistor 216 and a capacitor 218 of which one side is connected to the input pad 205 and the other is connected to one side of the bias NMOS transistor 216. Here, one side of the PMOS transistor 212 and a gate thereof are connected to the power supply voltage VDD and the other side is connected to the input pad 205. One side of the NMOS transistor 214 is connected to the input pad 205 and the other is connected to the ground voltage VSS. The bias NMOS transistor 216 is used for always turning on the NMOS transistor 214, wherein one side of the bias NMOS transistor 216 is connected to the gate of the NMOS transistor 214 and the other is connected to the other side of the capacitor 218. In the first preferred embodiment, though there is employed the PMOS transistor 212, the PMOS transistor 212 may be omitted for performing the HBM/MM electrostatic discharge operation. However, the PMOS transistor 212 is used for the first discharging circuit for enhancing ESD efficiency in the first preferred embodiment.

The second discharging circuit 220 is used for discharging electrostatic charges accumulated in the internal circuit, i.e., for the CDM electrostatic discharge. The second discharging circuit 220 of the present invention is provided with a pair of diodes 220 disposed between the input pad 205 and the data input buffer 230. In detail, the pair of diodes 220 is used for discharging electrostatic charges accumulated in the internal circuit through the input pad 205, wherein the pair of diodes 200 has a first diode 222 disposed between the input pad 205 and a power supply voltage VDD of the data input buffer 230 and a second diode 224 disposed between the input pad 205 and a ground voltage VSS of the data input buffer 230. On the contrary to the first discharging circuit 210, the second discharging circuit 220 provides a discharging pathway that the electrostatic charges can be effectively discharged from the charged device into an exterior. It is noted that the first diode 222 may be omitted in the second discharging circuit 220 for the CDM electrostatic discharge. But, in order to improve CDM ECD efficiency, it is preferable to employ the first diode 222 in the second discharging circuit 220.

Figure 3:
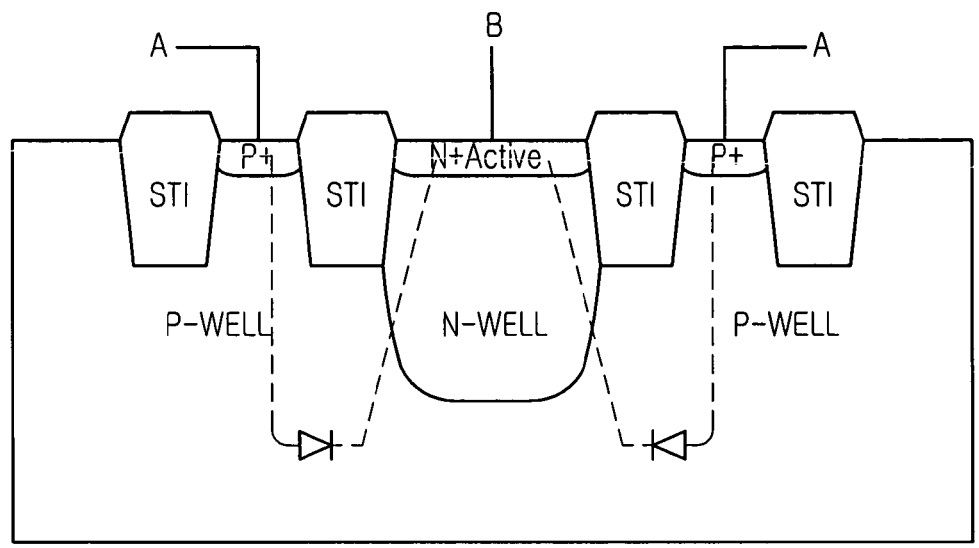
FIG. 3 is a cross sectional view setting forth a diode of the ESD protection circuit in accordance with the first preferred embodiment of the present invention depicted in FIG. 2.

Referring to FIG. 3, there is shown a cross sectional view setting forth the first and the second diodes 222, 224 of the second discharging circuit 220 for use in the inventive ESD protection circuit 200.

In FIG. 3, there are p-wells and an n-well in a semiconductor substrate, wherein the p-wells and the n-well have low impurity concentration so that a depletion region between the p-well and the n-well is relatively large to render the diode have a high breakdown voltage. In case of the high breakdown voltage of the diodes 222, 224, the diodes 222, 224 can be effectively prevented from the damage incurred by the electrostatic surge current. Additionally, the large depletion area of the diodes 222, 224 renders a parasitic capacitance of p-n junction become small. In manufacturing the semiconductor device, typically, a parasitic resistor and the parasitic capacitor may be generated because of an interconnection line which interconnects devices each other. Therefore, the parasitic resistance and the parasitic capacitance make a low pass filter (LPF) in the long run. Since the breakdown voltage of the diodes 222, 224 becomes high in the inventive ESD protection circuit 200, the parasitic capacitance becomes small so as to avoid an LPF characteristic, which is a serious problem in the prior art. Therefore, the diodes 222, 224 with high breakdown voltage can be utilized for the MM or HBM of the ESD model as well as the CDM of the ESD model because of small parasitic capacitance.

Figure 4:
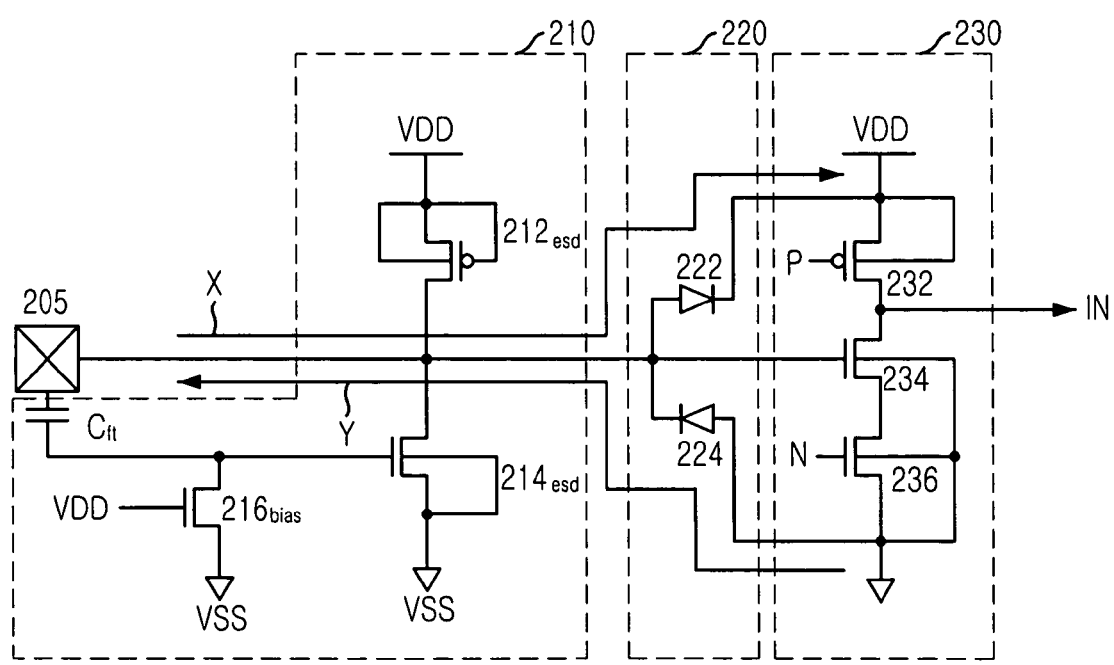
FIG. 4 is a circuit diagram setting forth a discharging pathway by means of a charged device model (CDM) in the ESD protection circuit in accordance with the first preferred embodiment of the present invention.

Referring to FIG. 4, there is shown a circuit diagram setting forth a discharging pathway by means of the charged device model of the ESD protection circuit 200 in accordance with the first preferred embodiment of the present invention. An operational mechanism of the inventive ESD protection circuit 200 will be illustrated in detail hereinafter.

In FIG. 4, the CDM electrostatic discharge is carried out through the pair of diodes 222, 224. That is, provided that voltage of the internal circuit is higher than that of the external object, the electrostatic charges discharge through the first diode 222, wherein the discharging pathway is denoted as X in FIG. 4. On the contrary, if voltage of the internal circuit is lower than that of the external object, the ESD proceeds through the second diode 224, wherein the discharging pathway is denoted as Y in FIG. 4. In comparison with the conventional ESD protection circuit, the present invention does not employ a resistor in the second discharging circuit 220 so that the bandwidth of the input signal is not decreased in spite of a high operational frequency. Furthermore, since the resistor is not utilized for the protection circuit, the LPF characteristic is not generated so that the semiconductor device can be operable stably without any interruption due to the ESD protection circuit 200.

Meanwhile, referring back to FIG. 2, the first discharging circuit 210 for the HBM or the MM has the bias MOS transistor 216 and the capacitor 218 disposed between the bias MOS transistor 216 and the input pad 205, which enables to turn on the NMOS transistor 214 instantly while high voltage owing to the HBM or the MM is applied to the input pad 205. Namely, high voltage applied to the input pad 205 means that high voltage is applied to one node of the capacitor 218. Subsequently, when high voltage is applied to one node of the capacitor 218, high voltage is also applied to the other node thereof owing to a coupling effect. This makes the NMOS transistor 214 is always turned on so as to discharge the electrostatic charges incurred by external charged objects. In other words, the electrostatic charges induced by the HBM or the MM can be rapidly discharged, to thereby secure an enhanced ESD protection property.

As described above, the inventive ESD protection circuit 200 of the first embodiment can be used for the semiconductor device without decreasing the bandwidth of the input signal so that the input signal is transmitted to the input buffer 230 stably. Moreover, in accordance with the ESD protection circuit 200 of the present invention, the electrostatic charges which are incurred by the ESD model such as the HBM, the MM or the CDM can be effectively and instantly discharged without injuring the semiconductor device. Therefore, it is possible to manufacture the reliable semiconductor device which has an enhanced resistance against a static electricity and can be reliably operable with high speed.

Figure 5:
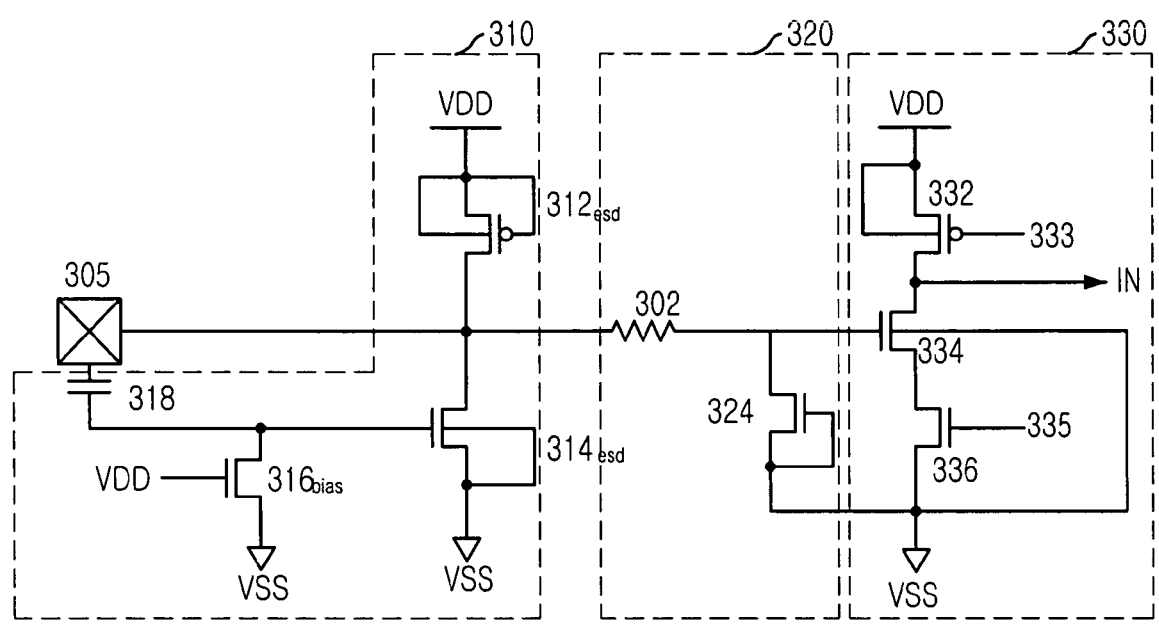
FIG. 5 is an ESD protection circuit of the semiconductor in accordance with a second preferred embodiment of the present invention.

Referring to FIG. 5, there is shown a circuit diagram setting forth another ESD protection circuit 300 in accordance with a second preferred embodiment of the present invention.

In FIG. 5, the ESD protection circuit 300 includes a first discharging circuit 310 for the HBM or the MM electrostatic discharge, a second discharging circuit 320 for the CDM electrostatic discharge and a data input buffer 330. The first discharging circuit 310 plays a role in discharging electrostatic charges incurred by the HBM or the MM, wherein the first discharging circuit 310 has a PMOS transistor 312, an NMOS transistor 314, a bias MOS transistor and a capacitor 318 disposed between the input pad 305 and the bias MOS transistor 316. In the first discharging circuit 310, a gate and one side of the PMOS transistor 312 is connected to a power supply voltage VDD and the other is connected to the input pad 305. One side of the NMOS transistor 314 is connected to the input pad 305 and the other is connected to a ground voltage VSS. Meanwhile, one side of the bias MOS transistor 316 is connected to the gate of the NMOS transistor 314 and the other is connected to the ground voltage VSS. A gate of bias MOS transistor 316 is connected to the power supply voltage VDD, to thereby always turn on the NMOS transistor 314.

The ESD protection circuit 300 of the second embodiment is now proposed in order to prevent the semiconductor device from the detrimental effect of the HBM or the MM electrostatic discharge by employing the capacitor 318 and the bias MOS transistor 316. In comparison with the conventional ESD protection circuit 100, the first discharging circuit 310 is only modified. That is, the ESD protection circuit 300 of the second embodiment is able to be applied to the semiconductor device where the CDM electrostatic discharge is not a serious problem. In other words, the LPF characteristic due to the resistor 322 and the parasitic capacitor does not affect the transmission of the input signal into the data input buffer 330. Therefore, the ESD protection circuit 300 of the second embodiment is suitable for the semiconductor device which is operated in a low frequency level.

In the second embodiment, since the second discharging circuit 320 and the data input buffer 330 are similar to those disclosed in the prior art, further explanation will be abbreviated here. Reference numerals of 322, 324, 332, 334, 336, 333 and 335 denote a resistor, a MOS transistor, a PMOS transistor, a first NMOS transistor, a second NMOS transistor, a first control signal and a second control signal, respectively. In the second embodiment, the first discharging circuit 310 for the HBM or the MM has the bias MOS transistor 316 and the capacitor 318 therein so that the electrostatic discharge may be rapidly performed to thereby enhance the ESD protection property.

The present application contains subject matter related to the Korean patent application No. KR 2003-98493, filed in the Korean Patent Office on Dec. 29, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An electrostatic discharge (ESD) protection circuit, comprising:
   an input pad for receiving a data;
   a data input buffer supplied with a first power source for transmitting the data inputted from the input pad to an internal circuit;
   a first discharging means supplied with a second power source for a HBM/MM ESD connected to the input pad; and
   a second discharging means provided with at least one diode supplied with the first power source for a CDM ESD, disposed between the input pad and the data input buffer for discharging charges accumulated in an internal circuit through a VDD terminal, wherein a substantial resistance is absent between the input pad and the data input buffer.

2. The ESD protection circuit as claimed in claim 1, wherein the first discharging means includes:
   an NMOS transistor of which one side is connected to a ground and the other side is connected to the input pad;
   a bias MOS transistor of which one side is connected to a gate of the NMOS transistor for turning on the NMOS transistor, wherein a power supply voltage is applied to a gate thereof; and
   a capacitor disposed between the input pad and the bias MOS transistor.

3. The ESD protection circuit as claimed in claim 2, wherein the first discharging means further includes a PMOS transistor of which one side and a gate of the PMOS transistor are connected to the second power supply voltage and the other side is connected to the input pad.

4. The ESD protection circuit as claimed in claim 1, wherein the second discharging means further includes another diode disposed between the input pad and a ground voltage of the data input buffer.

5. The ESD protection circuit as claimed in claim 1, wherein the diode of the second discharging means includes a first and a second diodes, wherein the first diode is disposed between the input pad and the first power supply of the data input buffer and a second diode is disposed between the input pad and the ground of the data input buffer.

6. The ESD protection circuit as claimed in claim 1, wherein the diode has a high breakdown voltage by adjusting an impurity concentration.

7. An electrostatic discharge (ESD) protection circuit, comprising:
   an input pad for receiving a data;
   a data input buffer supplied with a first power source for transmitting the data inputted from the input pad to an internal circuit;
   a first discharging means supplied with a second power source for a HBM/MM ESD connected to the input pad; and
   a second discharging means provided with at least one diode supplied with the first power source for a CDM ESD, disposed between the input pad and the data input buffer for discharging charges accumulated in an internal circuit through a VDD terminal, wherein a substantial resistance is absent between the input pad and the data input buffer and the diode comprises a p-n junction of which an impurity concentration is adjusted thereby providing the diode with a high breakdown voltage.

8. The ESD protection circuit as claimed in claim 7, wherein the diode of the second discharging means includes a first and a second diodes, wherein the first diode is disposed between the input pad and the first power supply of the data input buffer and a second diode is disposed between the input pad and the ground of the data input buffer.

* * * * *